(12) United States Patent
O'Brien

(10) Patent No.: US 7,953,511 B1
(45) Date of Patent: May 31, 2011

(54) SYSTEM AND METHOD FOR REDUCING PROCESSING ERRORS DURING WAFER FABRICATION EMPLOYING A 2D WAFER SCRIBE AND MONITORING SYSTEM

(75) Inventor: Allan O'Brien, Wemyss Bay (GB)

(73) Assignee: National Semiconductor Corporation, Santa Clara, CA (US)

( * ) Notice: Subject to any disclaimer, the term of this patent is extended or adjusted under 35 U.S.C. 154(b) by 642 days.

(21) Appl. No.: 11/903,354

(22) Filed: Sep. 21, 2007

(51) Int. Cl.
| | |
|---|---|
| G06F 19/00 | (2006.01) |
| G06F 7/00 | (2006.01) |
| G06F 17/00 | (2006.01) |
| G06K 7/10 | (2006.01) |
| G06K 15/12 | (2006.01) |
| G21K 5/10 | (2006.01) |
| H01J 37/08 | (2006.01) |
| H01L 21/00 | (2006.01) |
| H01L 21/66 | (2006.01) |
| G01R 31/26 | (2006.01) |

(52) U.S. Cl. ..... 700/116; 700/121; 700/225; 235/462.11; 235/462.15; 235/462.41; 250/492.21; 438/7; 438/16

(58) Field of Classification Search .............. 700/110, 700/115, 116, 215, 218, 225, 121; 235/435, 235/439, 454, 462.01, 462.41, 462.42, 491, 235/462.09, 462.11, 462.15, 462.18, 462.23, 235/462.24; 250/492.1, 492.21, 492.22; 356/237.1–237.3, 237.5; 438/14, 16, 7; 382/152, 382/145, 151
See application file for complete search history.

(56) References Cited

U.S. PATENT DOCUMENTS

| | | | | |
|---|---|---|---|---|
| 5,350,715 A * | 9/1994 | Lee | ................. | 438/16 |
| 5,841,661 A * | 11/1998 | Buchanan et al. | ............ | 700/121 |
| 6,185,511 B1 * | 2/2001 | Steffan et al. | .................. | 702/81 |
| 6,298,280 B1 * | 10/2001 | Bonora et al. | .............. | 700/218 |
| 6,478,532 B1 * | 11/2002 | Coady et al. | .................. | 414/783 |
| 6,596,965 B2 * | 7/2003 | Jeong et al. | ............ | 219/121.68 |
| 6,597,427 B1 * | 7/2003 | Katsu et al. | .................. | 349/192 |
| 6,729,462 B2 * | 5/2004 | Babbs et al. | ............... | 198/346.2 |
| 6,748,293 B1 * | 6/2004 | Larsen | ......................... | 700/218 |
| 6,809,809 B2 * | 10/2004 | Kinney et al. | .............. | 356/237.5 |
| 6,866,200 B2 * | 3/2005 | Marx et al. | .................... | 235/491 |
| 7,023,003 B2 * | 4/2006 | Li et al. | .................... | 250/492.21 |
| 7,034,921 B2 * | 4/2006 | Tanaka | ............................ | 355/53 |
| 7,041,990 B2 * | 5/2006 | Kim et al. | ................. | 250/492.21 |
| 7,187,993 B2 * | 3/2007 | Kay et al. | .................... | 700/110 |
| 7,229,021 B2 * | 6/2007 | Vesikivi et al. | ........... | 235/462.01 |
| 7,266,418 B2 * | 9/2007 | Nakayama et al. | ........... | 700/115 |
| 7,287,698 B2 * | 10/2007 | Barrus | .................... | 235/462.15 |
| 7,314,766 B2 * | 1/2008 | Sugamoto et al. | ................ | 438/8 |
| 7,346,412 B2 * | 3/2008 | Tokorozuki et al. | .......... | 700/110 |
| 7,515,982 B2 * | 4/2009 | Varadhan et al. | ............. | 700/100 |
| 7,652,224 B2 * | 1/2010 | Lim | ........................ | 219/121.68 |

(Continued)

*Primary Examiner* — Crystal J Barnes-Bullock

(57) ABSTRACT

A system and method is disclosed for reducing processing errors during the fabrication of integrated circuit wafers. A 2D dot matrix wafer scribe that contains coded information is placed on a wafer. The coded information contains wafer information such as the wafer lot number. The wafer is then placed in an ion implantation system. A camera in the ion implantation system is then used to photograph the dot matrix wafer scribe on the wafer. The information about the wafer is then decoded from the photograph of the dot matrix wafer scribe. A station controller that operates the ion implantation system then uses the information from the dot matrix wafer scribe to determine whether the wafer is suitable for ion implantation. The wafer is implanted only when the information from the dot matrix wafer scribe matches information about the wafer that has been previously stored in the station controller.

20 Claims, 10 Drawing Sheets

U.S. PATENT DOCUMENTS

| | | | |
|---|---|---|---|
| 7,680,557 B2 * | 3/2010 | Kim et al. ..................... | 700/121 |
| 7,700,381 B2 * | 4/2010 | Arikado et al. ................ | 438/14 |
| 7,702,413 B2 * | 4/2010 | Ushiku et al. ................. | 700/121 |
| 7,813,542 B2 * | 10/2010 | Lee et al. ..................... | 382/151 |
| 7,818,652 B2 * | 10/2010 | Sakata ......................... | 714/774 |
| 2007/0081714 A1 * | 4/2007 | Wallack et al. .............. | 382/152 |
| 2007/0142960 A1 * | 6/2007 | Bollinger et al. ............ | 700/212 |
| 2007/0152058 A1 * | 7/2007 | Yeakley et al. ........... | 235/462.01 |
| 2008/0037055 A1 * | 2/2008 | Yun .............................. | 358/1.15 |
| 2008/0105748 A1 * | 5/2008 | Lei ........................... | 235/462.42 |
| 2008/0313205 A1 * | 12/2008 | Elgar et al. .................... | 707/102 |

* cited by examiner

SYSTEM AND METHOD FOR REDUCING PROCESSING ERRORS DURING WAFER FABRICATION EMPLOYING A 2D WAFER SCRIBE AND MONITORING SYSTEM

TECHNICAL FIELD OF THE INVENTION

The present invention relates generally to the manufacture of integrated circuits and, more particularly, to improvements in the manufacture of wafers of integrated circuits.

BACKGROUND OF THE INVENTION

Processing errors sometimes occur during the manufacture of wafers of integrated circuits. Processing errors are a major cause of the creation of integrated circuit wafer scrap during ion implantation procedures. For example, if the wafers that are loaded into an ion implantation system have already been implanted, then subjecting the wafers to a second ion implantation process will ruin the wafers. In many ion implantation systems there is presently no way to know whether the integrated circuit wafers have been correctly loaded into the ion implantation system.

FIG. 1 illustrates a block diagram of an embodiment of an exemplary prior art system 100 for implanting ions in integrated circuit wafers. Prior art system 100 comprises an ion implantation system 110. The prior art ion implantation system 110 may comprise, for example, a GSD200E2 Ion Implanter manufactured by Axcelis Corporation. The ion implantation system 110 comprises a wafer cassette 120 that is capable of holding an integrated circuit wafer 130 during an ion implantation process.

The ion implantation system 110 also comprises an ion implantation control system 140 that controls the ion implantation process in the ion implantation system 110. Ion implantation control system 140 comprises computer hardware and software that controls the timing and intensity of the ion implantation process that implants ions in the wafer 130. As shown in FIG. 1, the ion implantation control system 140 is coupled to a station controller 150. The station controller 150 comprises computer hardware and software that controls the operation of the ion implantation system 110 through the ion implantation control system 140.

The station controller 150 is also coupled to a user interface 160. The user interface 160 provides a user with information from the station controller 150 that relates to the operation and status of the ion implantation processes that are carried out in the ion implantation system 110. The user interface 160 may comprise a computer display, and a keyboard, and a computer mouse (not shown in FIG. 1) and other similar types of conventional computer access devices.

The ion implantation system 110 comprises a sensor unit 170 that is coupled to the wafer cassette 120 and that is also coupled to the station controller 150 through the ion implantation control system 140. The sensor unit 170 receives an electronic signal from the wafer cassette 120 that indicates that a wafer 130 has been placed into the wafer cassette 120. The sensor unit 170 also sends an electronic signal to the station controller 150 that indicates that a wafer 130 has been placed into the wafer cassette 120.

When a wafer 130 of integrated circuits is placed into a wafer cassette 120 and placed into position within the ion implantation system 110, there is presently no way for a user to know if the wafer 130 is a wafer than has already been implanted. There is also no way for a user to know if the wafer 130 that has been placed into the wafer cassette 120 correctly corresponds to and matches the wafer information with which the station controller 150 identifies the wafer that is presently within the wafer cassette 120. There is presently no way for a user to be sure that the wafer 130 that has been placed into the wafer cassette 120 has been correctly identified.

A wafer 130 that has been subjected to an incorrect implantation process is ruined and has to be discarded as scrap. Incorrectly identifying wafers and subsequently incorrectly implanting those wafers is a major cause of errors in the ion implantation process. One study estimated that as many as ten or eleven wafers per week are ruined by such processing errors. The loss caused by incorrectly implanted wafers may amount to a considerable amount of money and time.

Therefore, there is a need in the art for a system and method that allows a user to reduce the number of processing errors that occur during an ion implantation procedure. There is a need in the art for a system and method that is capable of efficiently identifying a wafer that is located within an ion implantation system before an ion implantation process is carried out on the wafer.

SUMMARY OF THE INVENTION

To address the above-discussed deficiencies of the prior art, it is a primary object of the present invention to provide a system and method for efficiently identifying a wafer that is located within an ion implantation system.

The system and method of the present invention comprises a camera. The camera is positioned so that the camera is capable of photographing a wafer when the wafer is placed into position within a wafer cassette in an ion implantation system. A lighting unit is provided to illuminate the wafer so that a clear photograph may be taken. And edge of the wafer is inscribed with a 2D dot matrix scribe. The 2D dot matrix scribe encodes identification information about the wafer (e.g., wafer lot number).

The camera comprises a controller that is capable of decoding the wafer identification information that is encoded in the 2D dot matrix scribe. The camera photographs the 2D dot matrix scribe and decodes the information within the scribe. The camera then sends the information to an ion implantation station controller via a programmable logic controller. The station controller will not allow the ion implantation process to go forward if incorrect wafers have been placed in the ion implantation system. This ensures that the number of wafer processing errors is minimized.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 2 through 16 and the various embodiments used to describe the principles of the present invention in this patent document are by way of illustration only and should not be construed in any way to limit the scope of the invention. Those skilled in the art will understand that the principles of the present invention may be implemented in any type of suitably arranged ion implantation system.

Figure 1:
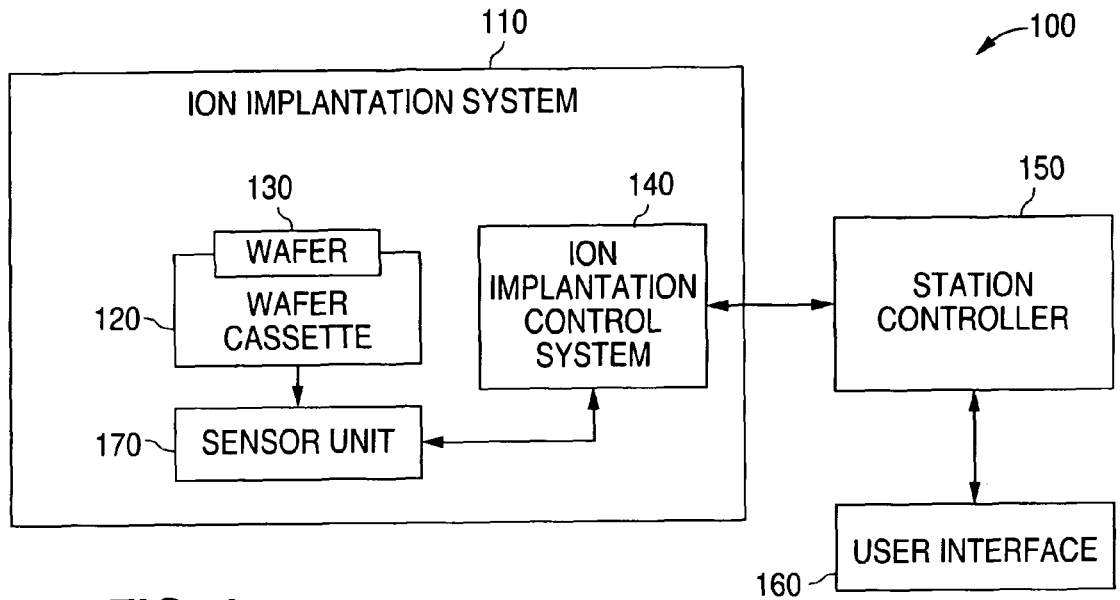
FIG. 1 is a block diagram that illustrates an exemplary prior art system for implanting ions in an integrated circuit wafer.
Figure 2:
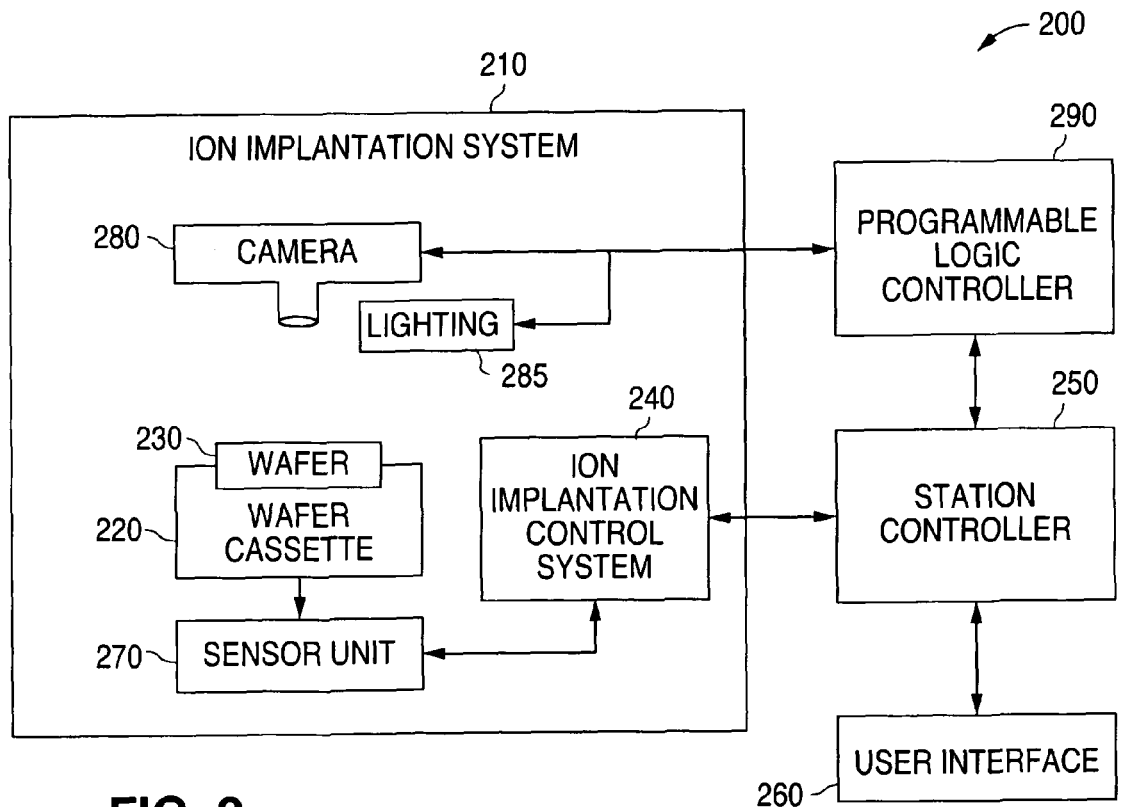
FIG. 2 is a block diagram that illustrates an advantageous embodiment of a system for implanting ions in an integrated circuit wafer according to the principles of the present invention.

FIG. 2 is a block diagram that illustrates an advantageous embodiment of a system 200 for implanting ions in an integrated circuit wafer according to the principles of the present invention. The system 200 comprises an ion implantation system 210. The ion implantation system 210 may comprise, for example, a GSD200E2 Ion Implanter manufactured by Axcelis Corporation. For convenience, the ion implantation system 210 may sometimes be referred to using the designation GSD 210. The ion implantation system 210 comprises a wafer cassette 220 that is capable of holding a wafer 230 of integrated circuits during an ion implantation process.

The ion implantation system 210 also comprises an ion implantation control system 240 that controls the ion implantation process in the ion implantation system 210. Ion implantation control system 240 comprises computer hardware and software that controls the timing and intensity of the ion implantation process that implants ions in the wafer 230. As shown in FIG. 2, the ion implantation control system 240 is coupled to a station controller 250. The station controller 250 comprises computer hardware and software that controls the operation of the ion implantation system 210 through the ion implantation control system 240.

The station controller 250 is also coupled to a user interface 260. The user interface 260 provides a user with information from the station controller 250 that relates to the operation and status of the ion implantation processes that are carried out in the ion implantation system 210. The user interface 260 may comprise a computer display, and a keyboard, and a computer mouse (not shown in FIG. 2) and other similar types of conventional computer access devices.

The ion implantation system 210 also comprises a sensor unit 270 that is coupled to the wafer cassette 220 and that is coupled to the station controller 250 through the ion implantation control system 240. The sensor unit 270 receives an electronic signal from the wafer cassette 220 that indicates that a wafer 230 has been placed into the wafer cassette 220. The sensor unit 270 also sends an electronic signal to the station controller 250 that indicates that a wafer 230 has been placed into the wafer cassette 220.

The ion implantation system 210 also comprises a camera 280 and a lighting unit 285. The camera 280 is positioned so that the camera 280 is capable of photographing the wafer 230 when the wafer is placed into position within the wafer cassette 220. In one advantageous embodiment of the invention, the camera 280 is mounted at a distance no less than fifty millimeters (50 mm) above the wafer 230. The lighting unit 285 is positioned so that the lighting unit 285 is capable of illuminating the wafer 230 when the wafer 230 is placed into position within the wafer cassette 220.

The system 200 of the present invention also comprises a programmable logic controller 290. The programmable logic controller 290 is coupled to the station controller 250 and to the camera 280 and the lighting unit 285. As will be more fully described, the station controller 250 operates the camera 280 and the lighting unit 285 via the programmable logic controller 290 to obtain information directly from the wafer 230 that is placed into the wafer cassette 220.

Figure 3:
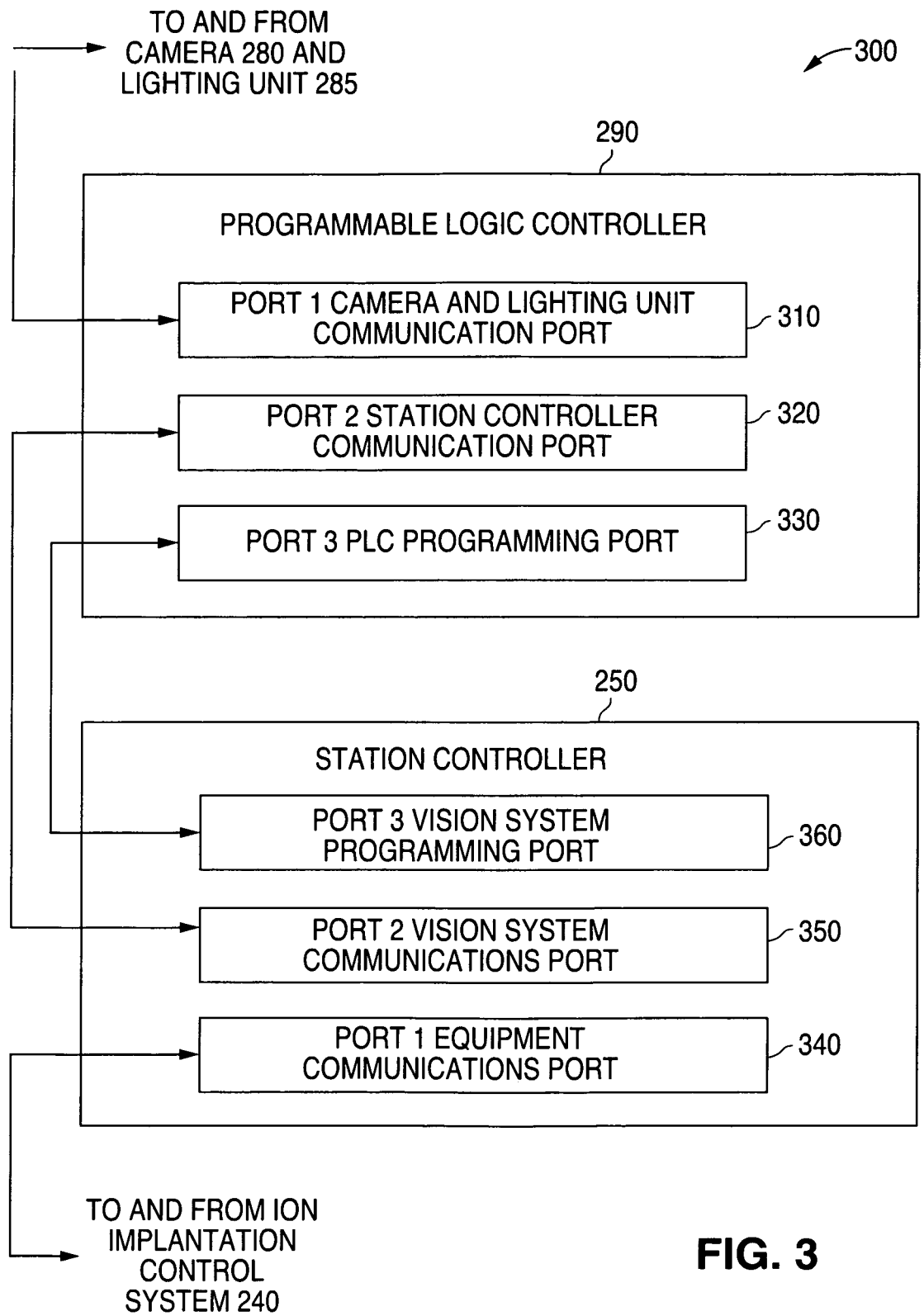
FIG. 3 is a block diagram that illustrates certain interconnections between a station controller and a programmable logic controller according to the principles of the present invention.

FIG. 3 is a block diagram 300 that illustrates certain interconnections between the station controller 250 and the programmable logic controller 290 according to the principles of the present invention. The programmable logic controller 290 comprises a first port (Port 1) designated Camera and Lighting Unit Communication Port 310. This port sends control signals to the camera 280 and to the lighting unit 285 and receives data from the camera 280.

The programmable logic controller 290 also comprises a second port (Port 2) designated Station Controller Communication Port 320. This port sends control signals and data to the station controller 250 and receives control signals and data from the station controller 250.

The programmable logic controller 290 also comprises a third port (Port 3) designated Programmable Logic Controller (PLC) Programming Port 330. This port also sends programming signals and data to the station controller 250 and receives programming signals and data from the station controller 250. The ports in the programmable logic controller 290 are RS232 ports.

The station controller 250 comprises a first port (Port 1) designated Equipment Communication Port 340. This port sends control signals and data to and from the ion implantation control system 240. The station controller 250 also comprises a second port (Port 2) designated Vision System Communications Port 350. This port sends control signals and data to and from the programmable logic controller 290. The station controller 250 also comprises a third port (Port 3) designated Vision System Programming Port 360. This port also sends programming signals and data to and from the programmable logic controller 290. The ports in the station controller 250 are RS232 ports.

In order to ensure that programmable logic controller 290 remains in constant communication with the station controller 250, every five (5) seconds the programmable logic controller 290 sends to the station controller 250 a selected ASCII string of letters (e.g., the letters WATCHDOG) followed by a system clock signal. The station controller 250 continually monitors the input from the programmable logic controller 290 for the Watchdog signal. If the station controller 250 does not see a new Watchdog signal every five (5) seconds, then the station controller 250 sends an error message (and, optionally, an alarm) to the user interface 260.

A prior art wafer 130 is provided with an alphanumeric scribe on the edge of the wafer that contains identification information for the wafer 130. Unfortunately, this alphanumeric scribe degrades as the wafer 130 undergoes processing steps (e.g., depositions, etch erosions). By the time the wafer 130 reaches the electrical test at the end of the processing line, the degradation of the scribe can make it difficult to tell the difference between the letter B and the numeral 8. In addition, there may be edge bead distortion that may obscure part (or all) of the scribe.

The method of the present invention provides an additional scribe on the edge of a wafer 230 that is placed within the wafer cassette 220. The additional scribe comprises a 2D dot matrix scribe that contains the lot number and the wafer number of the wafer 230. Preferably the 2D dot matrix scribe is a two millimeter (2 mm) by eight millimeter (8 mm) dot matrix scribe that contains eight (8) rows and thirty two (32) columns. The 2D dot matrix scribe contains dot matrix code symbols in accordance with the SEMI T7 Standard. The letters SEMI stand for Semiconductor Equipment and Materials International.

Figure 4:
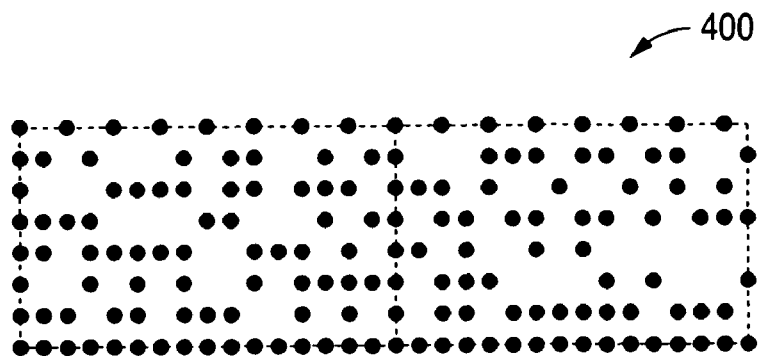
FIG. 4 illustrates a typical 2D dot matrix scribe.

FIG. 4 illustrates a typical 2D dot matrix scribe 400. The 2D dot matrix scribe 400 contains the lot number and the wafer number of the wafer 230 on which it is inscribed. When a wafer 230 with a 2D dot matrix scribe 400 is placed within the wafer cassette 220, the sensor unit 270 sends a signal through the ion implantation control system 240 to the station controller 250 to activate the vision system of the invention. The station controller 250 sends a signal through the programmable logic controller 290 to the camera 280 to take a photograph of the 2D dot matrix scribe 400 on the wafer 230. The light source of the lighting unit 285 is always turned on. In one advantageous embodiment the light source of the lighting unit 285 is a red light emitting diode (LED) array that is mounted directly below the camera 280.

The camera 280 then photographs the 2D dot matrix scribe 400 on the wafer 230. Camera 280 comprises an integrated microcontroller (not shown) that decodes the 2D dot matrix information from the 2D dot matrix scribe 400. In one advantageous embodiment of the invention, camera 280 comprises an Omron V400 2D Reader. Camera 280 then outputs the 2D dot matrix information in an ASCII format to the programmable logic controller 290. The programmable logic controller 290 sends the information to the station controller 250.

The station controller 250 then compares the information that has been retrieved from the 2D dot matrix scribe 400 on the wafer 230 with the information that has been previously stored in the station controller 250. If the two sets of information match, then the ion implantation process is allowed to go forward for the wafer 230. If the two sets of information do not match, then the station controller 250 will not allow the ion implantation process to go forward for the wafer 230 and will output an error message to the user interface 260.

Figure 6:
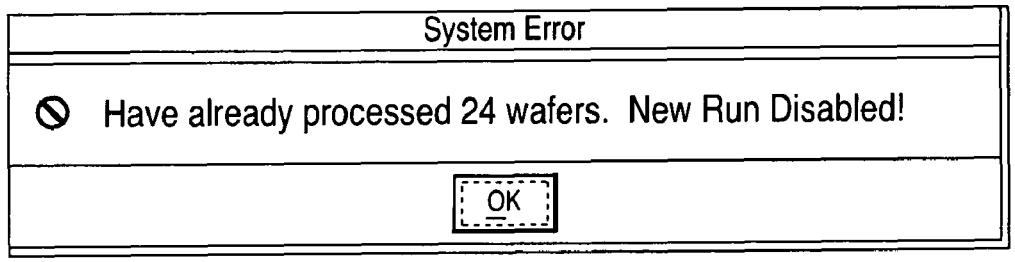
FIG. 6 is an exemplary first error indication that a wafer lot has already been processed.
Figure 5:
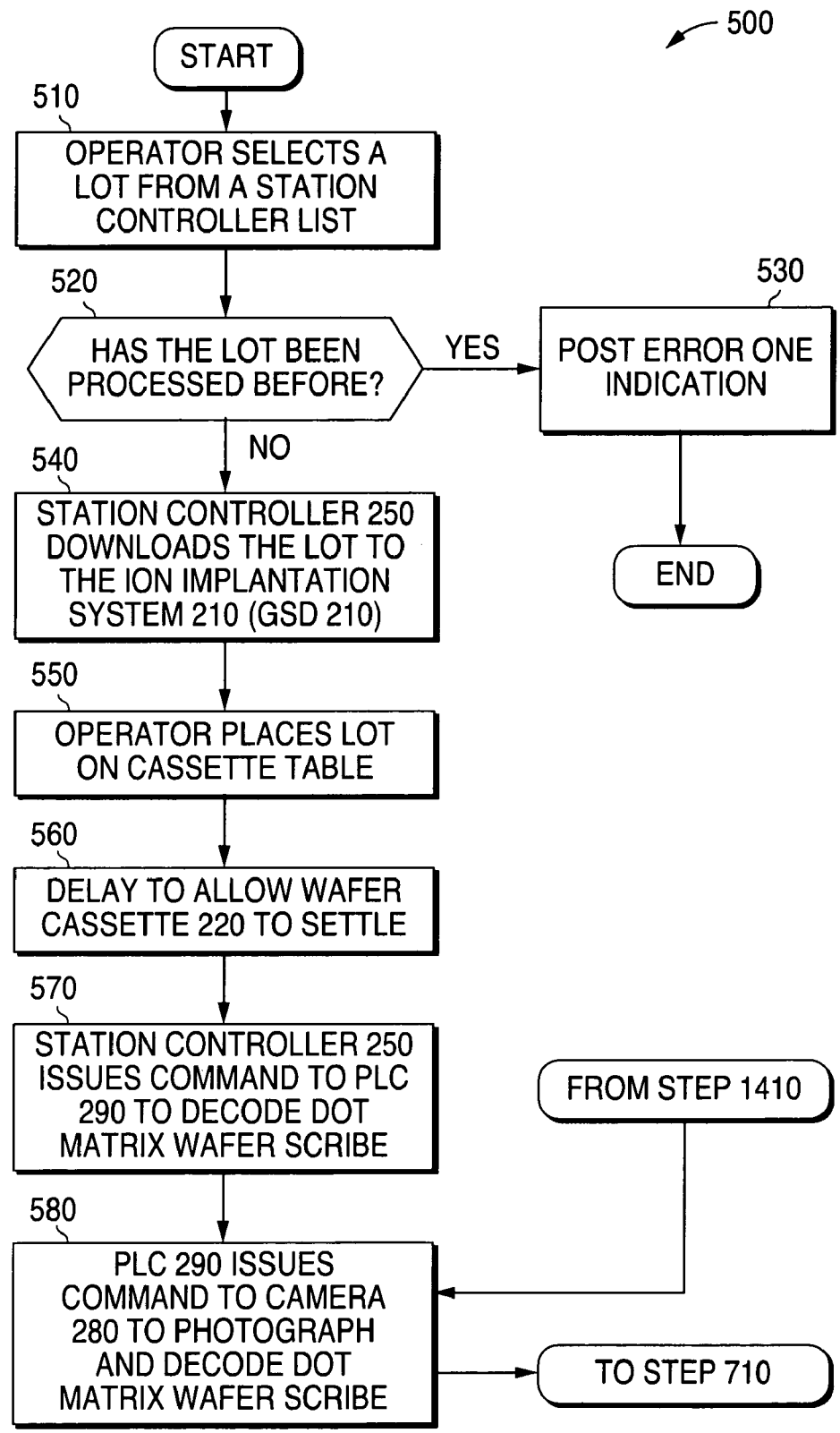
FIG. 5 is a first portion of a flow chart illustrating a portion of an advantageous embodiment of a method of the present invention.

FIG. 5 is a flow chart 500 illustrating a first portion of an advantageous embodiment of a method of the present invention. In the first step of the method, an operator selects a wafer lot from a station controller list (step 510). Then the station controller 250 determines whether the wafer lot has been processed before (decision step 520). If the wafer lot has been processed before, then the station controller 250 posts an Error One indication to the user interface 260 and stops the process (step 530). FIG. 6 illustrates an exemplary Error One indication that a wafer lot has already been processed.

If the wafer lot has not been processed before, then the station controller 250 downloads the wafer lot to the ion implantation system 210 (also referred to as GSD 210) (step 540). This opens the operator door. Then the operator places the wafer lot on a cassette table (step 550). Placing the wafer lot on the cassette table actuates the sensor unit 270. The sensor unit 270 is monitored by the station controller 250 through the ion implantation control system 240.

The station controller 250 then waits for approximately four (4) seconds to allow time for the wafer cassette 220 to settle (step 560). Then the station controller issues a command to the programmable logic controller (PLC) 290 to decode the dot matrix wafer scribe (step 570). The programmable logic controller (PLC) 290 issues a command to the camera 280 to photograph and decode the dot matrix wafer scribe on the wafer 230 (step 580). Control of the method then passes to step 710 of the method as shown in FIG. 7.

Figure 8:
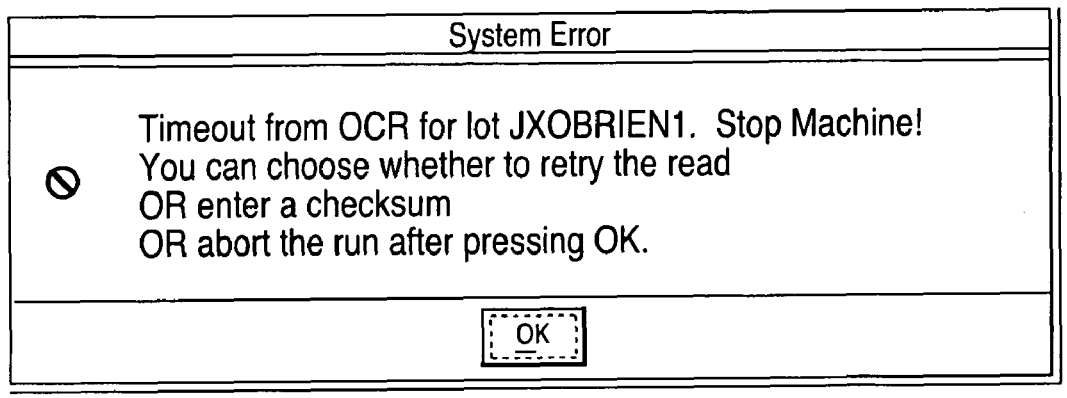
FIG. 8 is an exemplary second error indication that a timeout condition has occurred.
Figure 7:
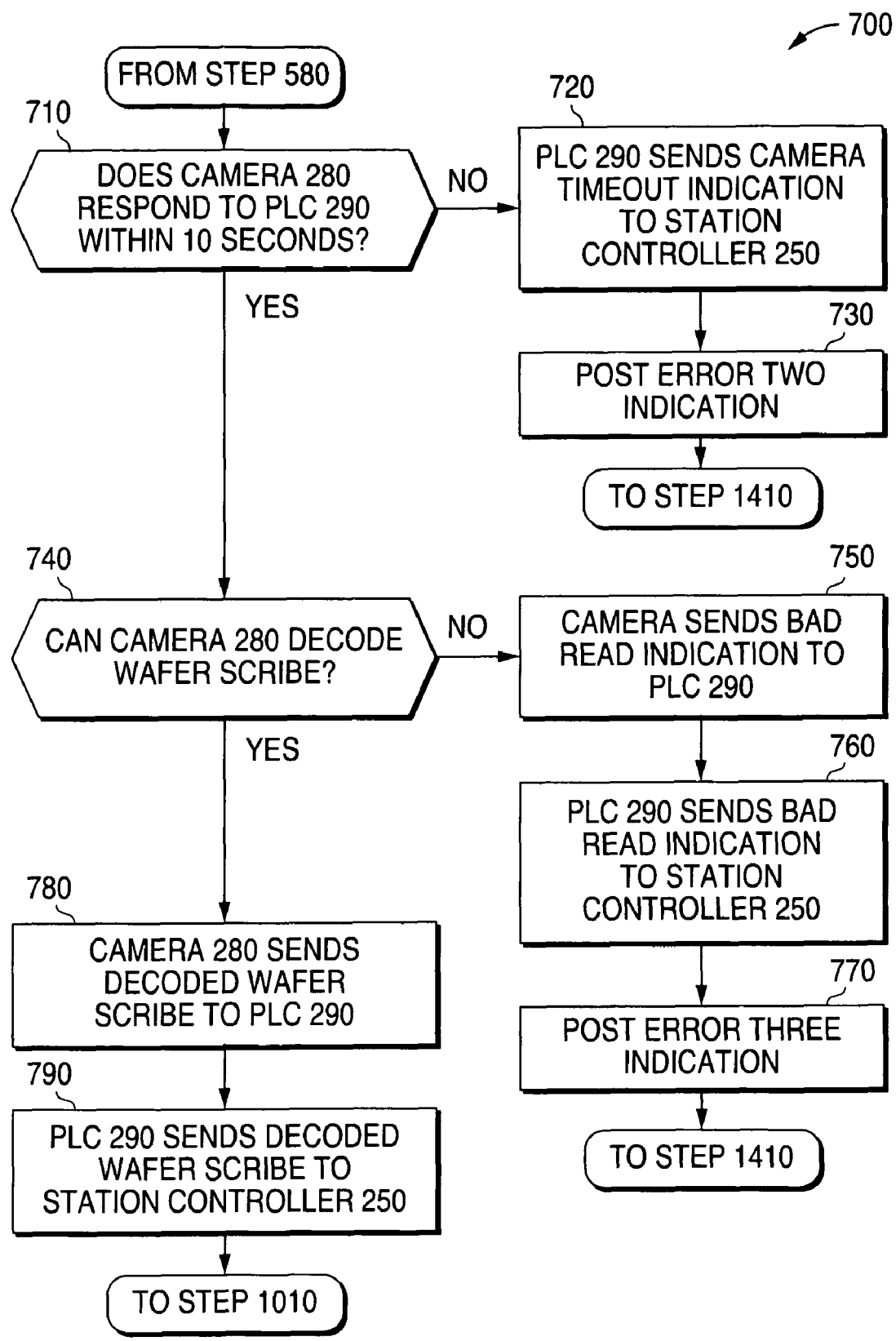
FIG. 7 is a second portion of a flow chart illustrating a portion of an advantageous embodiment of a method of the present invention.
Figure 14:
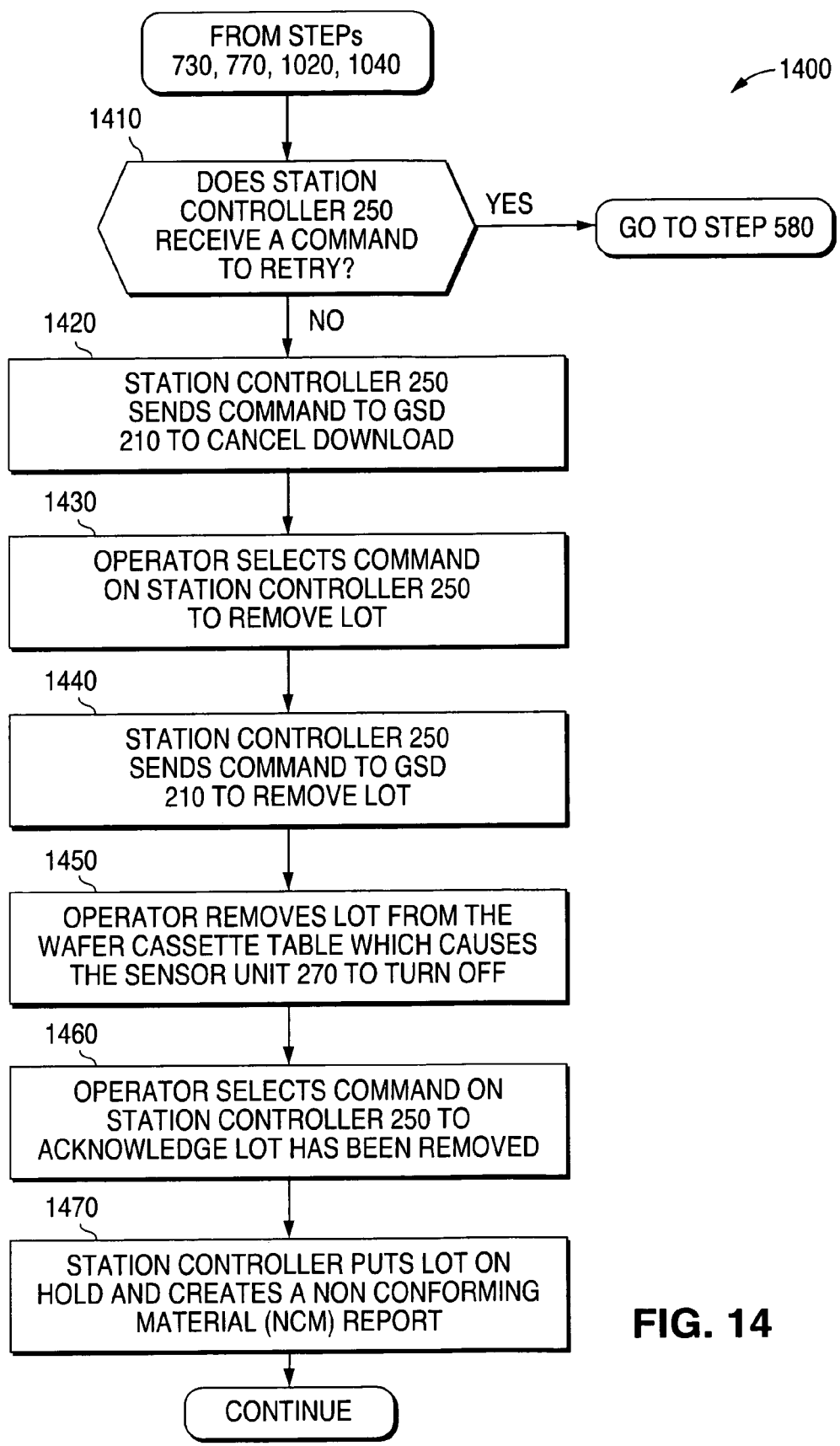
FIG. 14 is a fifth portion of a flow chart illustrating a portion of an advantageous embodiment of a method of the present invention.

FIG. 7 is a flow chart 700 illustrating a second portion of an advantageous embodiment of a method of the present invention. Control passes from step 580 of the method as shown in FIG. 5. The programmable logic controller (PLC) 290 determines whether the camera 280 has responded to the command of the programmable logic controller (PLC) 290 within ten (10) seconds (decision step 710). If the camera 280 has not responded within (10) seconds, then the programmable logic controller (PLC) 290 sends a camera timeout indication to the station controller 250 (step 720). The station controller 250 posts an Error Two indication to the user interface 260 and transfers control of the method to step 1410 as shown in FIG. 14 (step 730). FIG. 8 illustrates an exemplary Error Two indication that a timeout condition has occurred.

Figure 9:
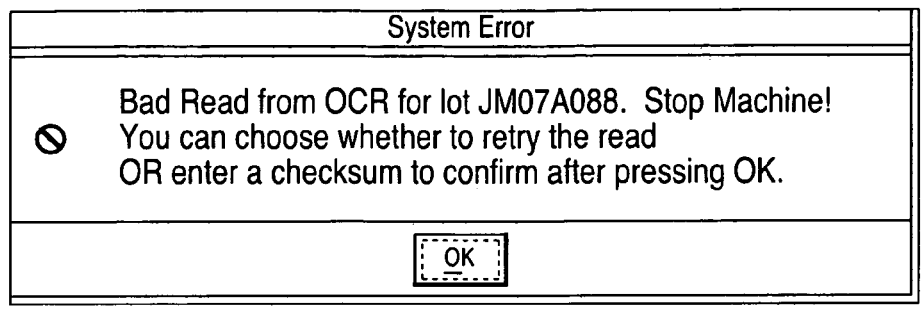
FIG. 9 is an exemplary third error indication that a bad camera read has occurred.

If the camera 280 does respond within ten (10) seconds then a determination must be made whether the camera 280 is able to properly decode the dot matrix wafer scribe (decision step 740). If the camera 280 is not able to properly decoded the dot matrix wafer scribe, then the camera 280 sends a "bad read" indication to the programmable logic controller 290 (step 750). Then the programmable logic controller (PLC) 290 sends the "bad read" indication to the station controller 250 (step 760). The station controller 250 posts an Error Three indication to the user interface 260 and transfers control of the method to step 1410 as shown in FIG. 14 (step 770). FIG. 9 illustrates an exemplary Error Three indication that a bad camera read has occurred.

If the camera 280 has properly decoded the dot matrix wafer scribe, then the camera 280 sends the decoded dot matrix wafer scribe information to the programmable logic controller 290 (step 780). Then the programmable logic controller 290 sends the decoded dot matrix wafer scribe information to the station controller 250. Control of the method then passes to step 1010 as shown in FIG. 10.

Figure 10:
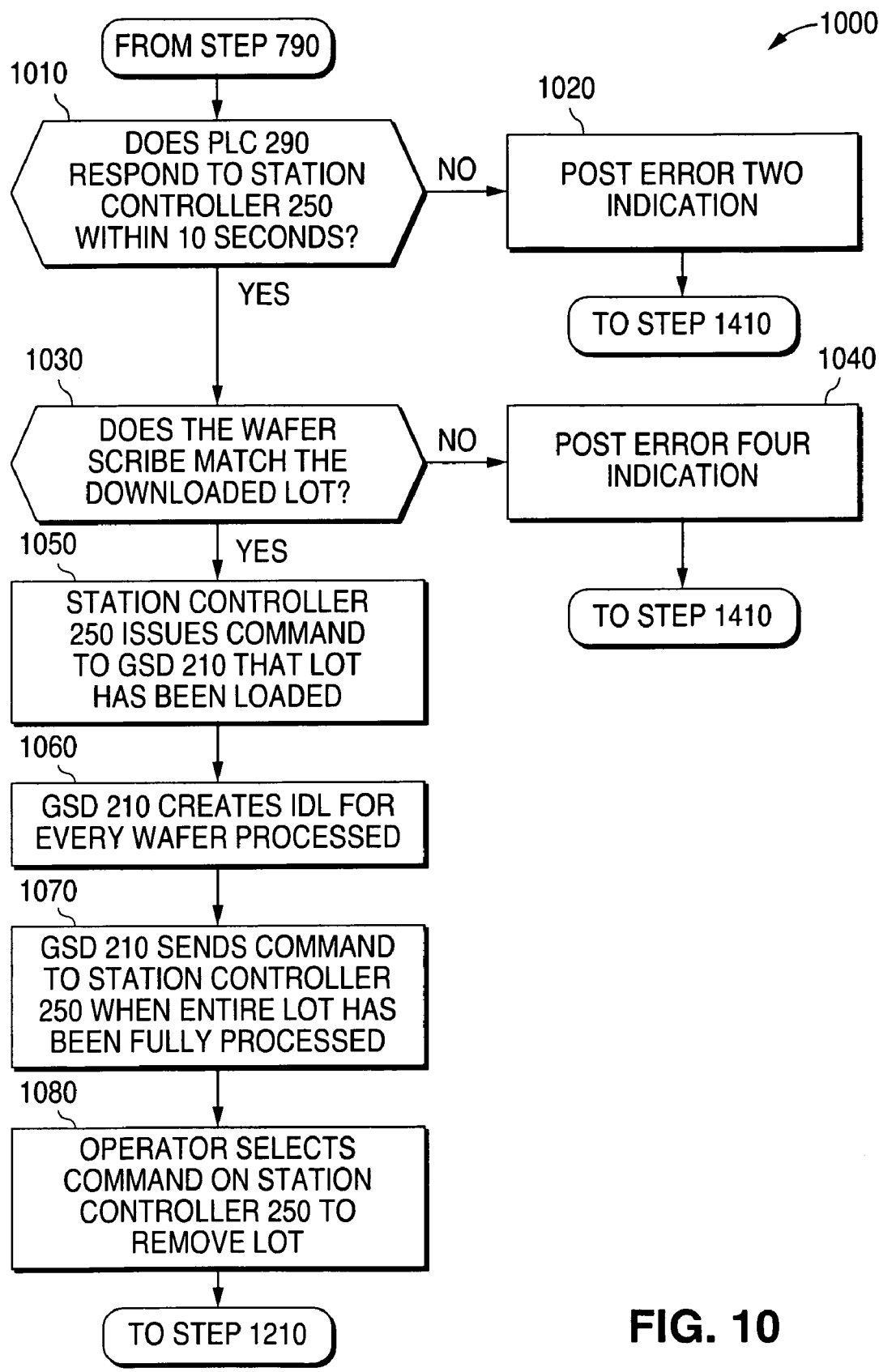
FIG. 10 is a third portion of a flow chart illustrating a portion of an advantageous embodiment of a method of the present invention.

FIG. 10 is a flow chart 1000 illustrating a third portion of an advantageous embodiment of a method of the present invention. Control passes from step 790 of the method as shown in FIG. 7. The station controller 250 determines whether the programmable logic controller 290 has responded to the station controller 250 within ten (10) seconds (decision step 1010). If the programmable logic controller 290 has not responded to the station controller 250 within ten (10) seconds, then the program controller 250 posts an Error Two indication to the user interface 260 and transfers control of the method to step 1410 as shown in FIG. 14 (step 1020). FIG. 8 illustrates an exemplary Error Two indication that that a timeout condition has occurred.

Figure 11:
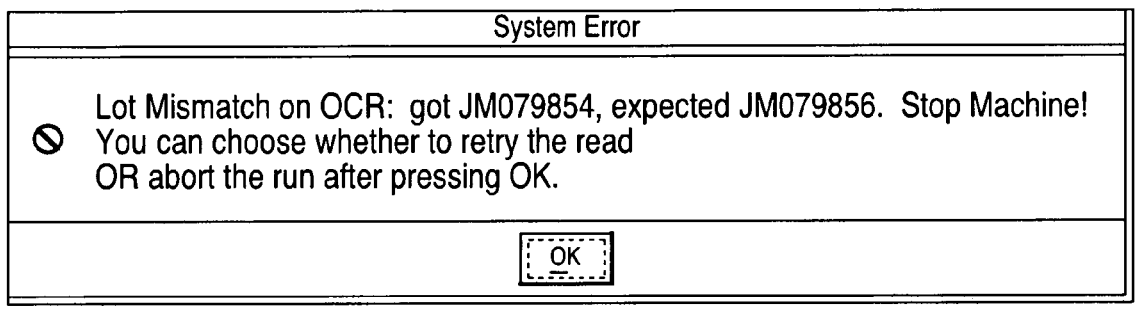
FIG. 11 is an exemplary fourth error indication that a wafer scribe did not match a downloaded lot.

If the programmable logic controller 290 has responded to the station controller 250 within ten (10) seconds, then the program controller 250 determines whether the decoded dot matrix wafer scribe information matches the downloaded wafer lot (decision step 1030). If the decoded dot matrix wafer scribe information does not match the downloaded wafer lot, then the program controller 250 posts an Error Four indication to the user interface 260 and transfers control of the method to step 1410 as shown in FIG. 14 (step 1040). FIG. 11 illustrates an exemplary Error Four indication that decoded dot matrix wafer scribe information did not match the downloaded lot.

If the decoded dot matrix wafer scribe information does match the downloaded wafer lot, then the station controller 250 issues a command to the ion implantation system 210 (GSD 210) that the wafer lot has been loaded (step 1050). This causes the operator door to close and the ion implantation process to begin. The ion implantation system 210 (GSD 210) creates an implant data log (IDL) for every wafer 230 that is processed (step 1060). The ion implantation system 210 (GSD 210) sends implant data log (IDL) information to the system controller 250 at the end of each run.

The ion implantation system (GSD 210) sends a command to the station controller 250 when the entire wafer lot has been fully processed (step 1070). Then the operator selects a command on the station controller 250 to remove the wafer lot (step 1080). Control of the method then passes to step 1210 as shown in FIG. 12.

Figure 12:
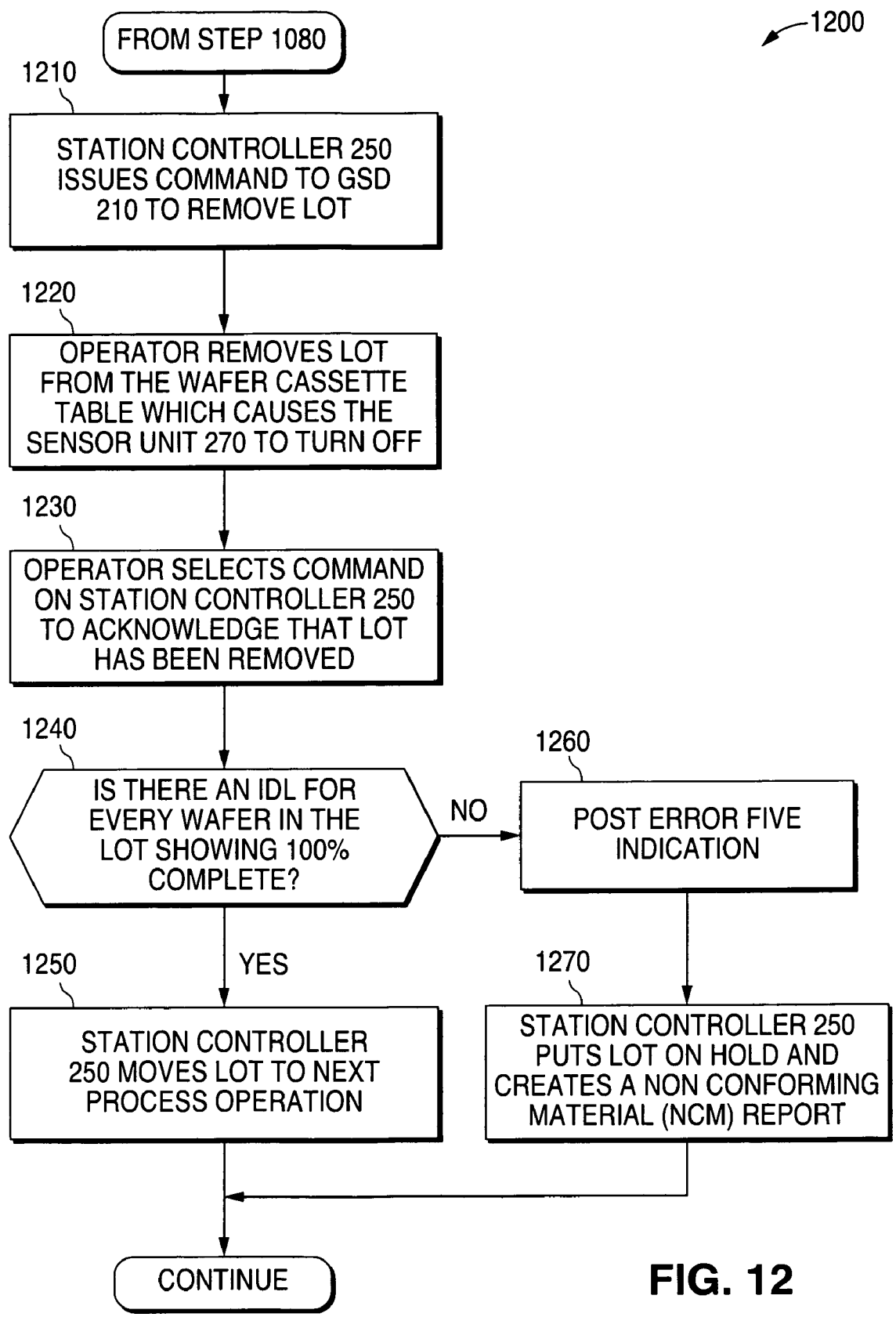
FIG. 12 is a fourth portion of a flow chart illustrating a portion of an advantageous embodiment of a method of the present invention.

FIG. 12 is a flow chart 1200 illustrating a fourth portion of an advantageous embodiment of a method of the present invention. Control passes from step 1080 of the method as shown in FIG. 10. The station controller 250 issues a command to the ion implantation system 210 (GSD 210) to remove the wafer lot (step 1210). This causes the operator door to open. Then the operator removes the wafer lot from the wafer cassette table (step 1230). Removal of the wafer lot from the wafer cassette table causes the sensor unit 270 to turn off. As previously mentioned, the status of the sensor unit 270 is monitored by the station controller 250 through the ion implantation control system 240.

Figure 13:
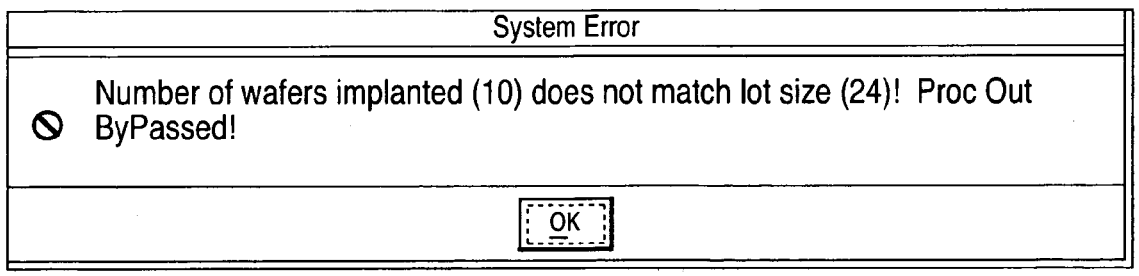
FIG. 13 is an exemplary fifth error indication that there is not an implant data log (IDL) for every wafer showing one hundred percent completion.

The operator then selects a command on the station controller 250 to acknowledge that the wafer lot has been removed (step 1230). This command causes the operator door to close. The station controller 250 then determines whether there is an implant data log (IDL) for every wafer in the wafer lot showing one hundred percent (100%) completion (decision step 1240). If there is not one hundred percent (100%) completion, then the station controller 250 posts an Error Five indication to the user interface 260 (step 1260). FIG. 13 illustrates an exemplary Error Five indication that there is not an implant data log (IDL) for every wafer showing one hundred percent (100%) completion.

The station controller 250 then puts the wafer lot on hold and creates a Non-Conforming Material (NCM) report (step 1270). The station controller 250 then continues operations.

If the decision step 1240 determines that there is one hundred percent (100%) completion, then the station controller 250 moves the wafer lot to the next process operation (step 1250). The station controller 250 then continues operations.

FIG. 14 is a flow chart 1400 illustrating a fifth portion of an advantageous embodiment of a method of the present invention. Control passes from step 730 or step 770 of the method as shown in FIG. 7, or from step 1020 or step 1040 from the method as shown in FIG. 10. The station controller 250 determines whether it has received a command to retry the steps of the method (decision step 1410). If the station controller 250 has received a command to retry the steps of the method, then control passes to step 580 as shown in FIG. 5 and the method steps are repeated.

If the station controller 250 has not received a command to retry the steps of the method, the station controller 250 sends a command to the ion implantation system 210 (GSD 210) to cancel the download of the wafer lot (step 1420). Then the operator selects a command on the station controller 250 to remove the wafer lot (step 1430). The station controller 250 issues a command to the ion implantation system 210 (GSD 210) to remove the wafer lot (step 1440). This causes the operator door to open.

Then the operator removes the wafer lot from the wafer cassette table (step 1450). Removal of the wafer lot from the wafer cassette table causes the sensor unit 270 to turn off. As previously mentioned, the status of the sensor unit 270 is monitored by the station controller 250 through the ion implantation control system 240.

The operator then selects a command on the station controller 250 to acknowledge that the wafer lot has been removed (step 1460). This command causes the operator door to close. The station controller 250 then puts the wafer lot on hold and creates a Non-Conforming Material (NCM) report (step 1270). The station controller 250 then continues operations.

Figure 15:
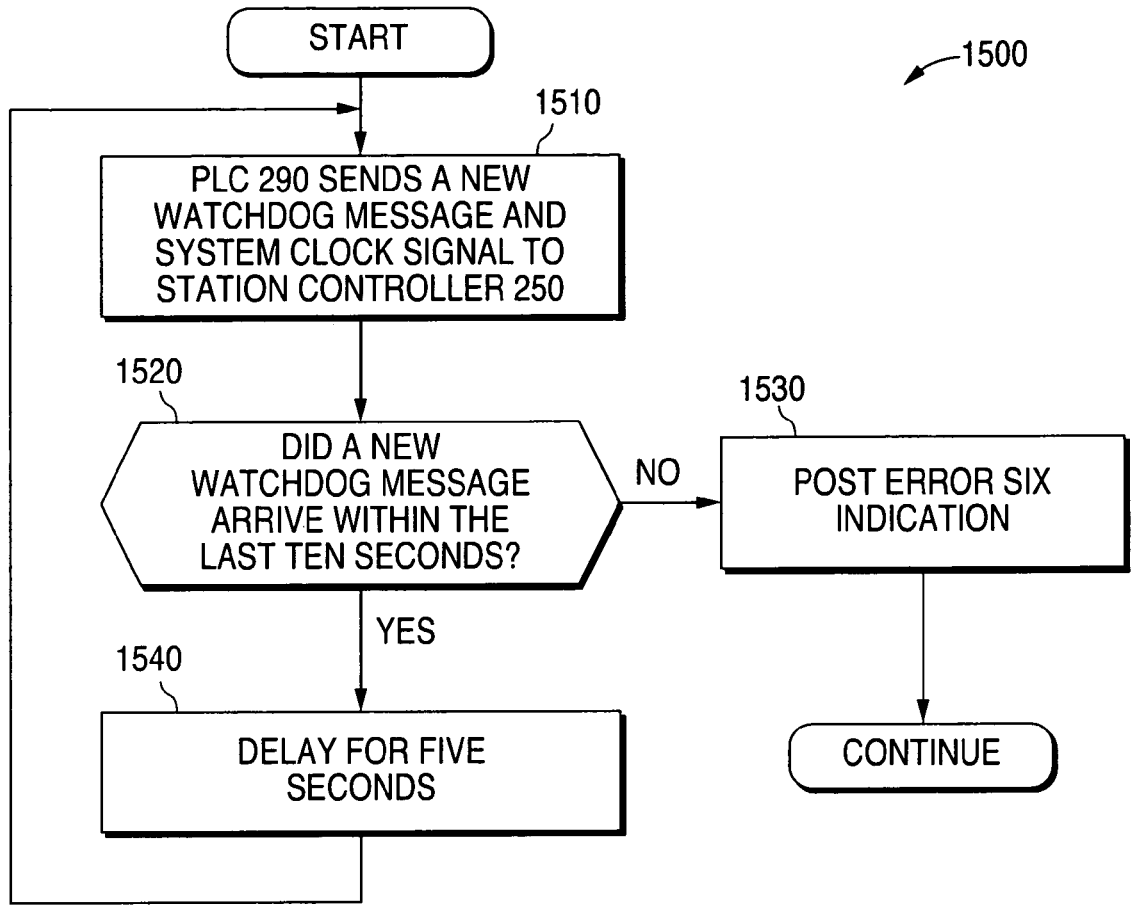
FIG. 15 is a sixth portion of a flow chart illustrating a portion of an advantageous embodiment of a method of the present invention.
Figure 16:
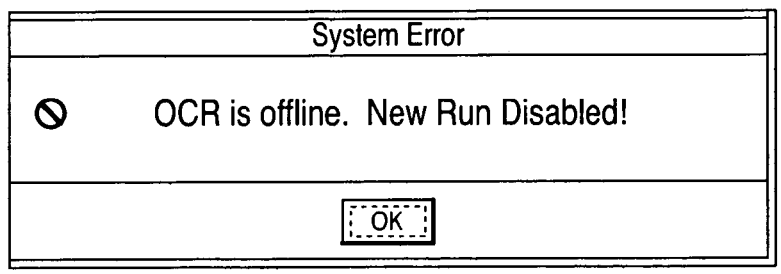
FIG. 16 is an exemplary sixth error indication that a new Watchdog message did not arrive within the last ten seconds.

FIG. 15 is a flow chart 1500 illustrating a sixth portion of an advantageous embodiment of a method of the present invention. The programmable logic controller (PLC) 290 sends a new Watchdog message and system clock signal to the station controller 250 (step 1510). The station controller 250 determines whether a new Watchdog message arrived within the last ten (10) seconds (decision step 1520). If a new Watchdog message did not arrive within the last ten (10) seconds, then the station controller 250 posts an Error Six indication to the user interface 260 (step 1530). FIG. 16 illustrates an exemplary Error Six indication that a new Watchdog message did not arrive within the last ten (10) seconds.

If a new Watchdog message did arrive within the last ten (10) seconds, then the station controller 250 enters a delay for five (5) seconds (step 1540). Then control passes back to step 1510 and the station controller 250 waits to receive a new Watchdog message from the programmable logic controller (PLC) 290.

Using the system and method described above, the present invention is able to of efficiently identify wafers that are located within an ion implantation system before an ion implantation process is carried out on the wafers. The system and method of the present invention significantly reduces the number of processing errors that occur during an ion implantation procedure.

Although the present invention has been described with several embodiments, various changes and modifications may be suggested to one skilled in the art. It is intended that the present invention encompass such changes and modifications as fall within the scope of the appended claims.

What is claimed is:

1. A method for reducing processing errors during a fabrication of a wafer of integrated circuits, the method comprising the steps of:
   placing the wafer in an ion implantation system, the wafer having a dot matrix wafer scribe;
   obtaining information about the wafer from the dot matrix wafer scribe by (i) photographing the dot matrix wafer scribe with a camera and (ii) analyzing the photograph of the dot matrix wafer scribe to obtain the information about the wafer;
   comparing the information about the wafer that is obtained from the dot matrix wafer scribe with information about the wafer that has been previously stored in a station controller that controls the ion implantation system; and
   implanting the wafer with an ion implantation process only when the information about the wafer that is obtained from the dot matrix wafer scribe matches the information about the wafer that has been previously stored in the station controller.

2. The method as set forth in claim 1 further comprising the steps of:
   determining whether the camera responds to a command to photograph the dot matrix wafer scribe within a selected period of time;
   obtaining the information about the wafer comprises obtaining the information about the wafer if the camera does respond to the command within the selected period of time; and
   indicating a timeout error condition if the camera does not respond to the command within the selected period of time.

3. The method as set forth in claim 1 further comprising the step of:
   indicating a bad read error condition if the camera is not able to photograph the dot matrix wafer scribe.

4. The method as set forth in claim 1 further comprising the step of:
   periodically sending a watchdog message to the station controller, the watchdog message indicating that a programmable logic controller is in communication with the station controller.

5. The method as set forth in claim 1 further comprising the step of:
   indicating an error condition when the information about the wafer that is obtained from the dot matrix wafer scribe does not match the information about the wafer that has been previously stored in the station controller.

6. A method for reducing processing errors during a fabrication of a wafer of integrated circuits, the method comprising the steps of:
   placing the wafer in an ion implantation system;
   determining whether a camera for photographing a dot matrix wafer scribe on the wafer is able to photograph the dot matrix wafer scribe;
   if the camera is able to photograph the dot matrix wafer scribe, obtaining information about the wafer from the dot matrix wafer scribe by photographing the dot matrix wafer scribe with the camera;
   comparing the information about the wafer that is obtained from the dot matrix wafer scribe with information about the wafer that has been previously stored in a station controller that controls the ion implantation system;
   implanting the wafer with an ion implantation process only when the information about the wafer that is obtained from the dot matrix wafer scribe matches the information about the wafer that has been previously stored in the station controller; and
   indicating a bad read error condition if the camera is not able to photograph the dot matrix wafer scribe.

7. A method for reducing processing errors during a fabrication of a wafer of integrated circuits, the method comprising the steps of:
   placing the wafer in an ion implantation system;
   obtaining information about the wafer from a dot matrix wafer scribe disposed on the wafer;
   determining from the information whether the wafer is suitable for ion implantation by comparing the information about the wafer that is obtained from the dot matrix wafer scribe with information about the wafer that has been previously stored in a station controller that controls the ion implantation system; and
   creating a non-conforming material report when the information about the wafer that is obtained from the dot matrix wafer scribe does not match the information about the wafer that has been previously stored in the station controller.

8. An apparatus for reducing processing errors during a fabrication of a wafer of integrated circuits, the apparatus comprising:
   an ion implantation system configured to implant ions into a wafer;
   a camera configured to photograph a dot matrix wafer scribe on the wafer;
   a programmable logic controller configured to control an operation of the camera; and
   a station controller configured to control an operation of the ion implantation system by:
      comparing information about the wafer that is obtained from the dot matrix wafer scribe with information about the wafer that has been previously stored in the station controller; and
      causing the ion implantation system to implant ions into the wafer only when the information about the wafer that is obtained from the dot matrix wafer scribe matches the information about the wafer that has been previously stored in the station controller.

9. The apparatus as set forth in claim 8 wherein the camera is configured to decode the information from the dot matrix wafer scribe and send the decoded information to the programmable logic controller.

10. The apparatus as set forth in claim 9 wherein the programmable logic controller is configured to send the decoded information from the camera to the station controller and the station controller is configured to use the decoded information to determine whether to implant the wafer with an ion implantation process.

11. The apparatus as set forth in claim 10 wherein the ion implantation system further comprises a lighting unit configured to illuminate the wafer in the ion implantation system so that the camera can photograph the dot matrix wafer scribe on the wafer.

12. The apparatus as set forth in claim 11 wherein the programmable logic controller comprises:
   a camera and light unit communication port configured to send control signals to the camera and receive data signals from the camera;
   a station controller communications port configured to send control signals and data to the station controller and receive control signals and data from the station controller; and
   a programmable logic controller programming port configured to send programming signals and data to the station controller and receive programming signals and data from the station controller.

13. The apparatus as set forth in claim 12 wherein the station controller comprises:
   an equipment communications port configured to send control signals and data to and from the ion implantation system;
   a vision system communications port configured to send control signals and data to and from the programmable logic controller; and
   a vision system programming port configured to send programming signals and data to and from the programmable logic controller.

14. The apparatus as set forth in claim 12 wherein the programmable logic controller is further configured to send a camera timeout indication to the station controller if the camera does not respond to a command to photograph the dot matrix wafer scribe within a selected period of time.

15. A method for reducing processing errors during a fabrication of a wafer of integrated circuits, the method comprising the steps of:
   placing the wafer in an ion implantation system that comprises a camera, the wafer comprising a dot matrix wafer scribe;
   determining whether the camera responds to a command to photograph the dot matrix wafer scribe within a selected period of time;
   if the camera does respond to the command to photograph the dot matrix wafer scribe within the selected period of time, photographing the dot matrix wafer scribe with the camera and decoding information about the wafer from a photograph of the dot matrix wafer scribe;
   comparing the information about the wafer that is obtained from the dot matrix wafer scribe with information about the wafer that has been previously stored in a station controller that controls the ion implantation system; and
   implanting the wafer with an ion implantation process only when the information about the wafer that is obtained from the dot matrix wafer scribe matches the information about the wafer that has been previously stored in the station controller.

16. The method as set forth in claim 15 further comprising the step of:
   indicating a timeout error condition if the camera does not respond to the command within the selected period of time.

17. The method as set forth in claim 15 further comprising the step of:
   periodically sending a watchdog message to a station controller, the watchdog message indicating that a programmable logic controller is in communication with the station controller.

18. The method as set forth in claim 15 further comprising the steps of:
   determining whether the camera that photographs the dot matrix wafer scribe is able to photograph the dot matrix wafer scribe; and
   indicating a bad read error condition if the camera is not able to photograph the dot matrix wafer scribe.

19. A method for reducing processing errors during a fabrication of a plurality of wafers for use in integrated circuits, each wafer comprising a dot matrix wafer scribe that contains coded information about the wafer, the method comprising the steps of:
   for each of the wafers:
      placing the wafer in an ion implantation system that comprises a camera;
      photographing the dot matrix wafer scribe of the wafer with the camera;
      decoding the information about the wafer from a photograph of the dot matrix wafer scribe;
      determining from the information whether the wafer is suitable for ion implantation;
      implanting the wafer with an ion implantation process if the wafer is suitable for ion implantation; and
      creating an implant data log for the implanted wafer; and
   sending a signal to a station controller when processing of the wafers is complete.

20. The method as set forth in claim 19 further comprising the steps of:
   determining if there is an implant data log for each implanted wafer of the plurality of wafers;
   indicating an error condition when there is not an implant data log for each implanted wafer of the plurality of wafers; and
   creating a non-conforming material report when there is not an implant data log for each implanted wafer of the plurality of wafers.

* * * * *